United States Patent
Kern et al.

(10) Patent No.: US 9,632,127 B2
(45) Date of Patent: Apr. 25, 2017

(54) METHOD FOR DETECTING AN ELECTRICAL CONTINUITY FAULT IN A NETWORK OF METALLIZATION STRIPS AND DEVICE FOR IMPLEMENTING SAME

(71) Applicant: Airbus Operations (S.A.S.), Toulouse (FR)

(72) Inventors: Xavier Kern, Toulouse (FR); Cédric Mouille, Blagnac (FR)

(73) Assignee: Airbus Operations (S.A.S.), Toulouse (FR)

( * ) Notice: Subject to any disclaimer, the term of this patent is extended or adjusted under 35 U.S.C. 154(b) by 263 days.

(21) Appl. No.: 14/498,710

(22) Filed: Sep. 26, 2014

(65) Prior Publication Data

US 2015/0091583 A1  Apr. 2, 2015

(30) Foreign Application Priority Data

Sep. 27, 2013 (FR) .................................... 13 59346

(51) Int. Cl.
| | |
|---|---|
| *G01R 31/14* | (2006.01) |
| *G01R 31/02* | (2006.01) |
| *G01R 31/00* | (2006.01) |
| *G01R 31/08* | (2006.01) |

(52) U.S. Cl.
CPC ......... *G01R 31/026* (2013.01); *G01R 31/008* (2013.01); *G01R 31/08* (2013.01)

(58) Field of Classification Search
CPC .............. G01R 31/025; G01R 31/2653; G01R 31/3272; H01L 22/34; G01N 1/32

USPC ........ 324/500, 509–555, 160–170, 676, 710, 324/76.11, 76.77; 702/117, 182–185, 56, 702/77, 81

See application file for complete search history.

(56) References Cited

U.S. PATENT DOCUMENTS

| | | | |
|---|---|---|---|
| 6,657,436 B1 | 12/2003 | Eslambolchi et al. | |
| 2004/0100272 A1 | 5/2004 | Styles | |
| 2006/0043976 A1 | 3/2006 | Gervais | |
| 2006/0287842 A1* | 12/2006 | Kim ....................... | G01H 9/004 702/183 |

(Continued)

OTHER PUBLICATIONS

French Search Report for Application Serial No. 1359346 dated Jul. 14, 2014.

*Primary Examiner* — Melissa Koval
*Assistant Examiner* — Trung Nguyen
(74) *Attorney, Agent, or Firm* — Jenkins, Wilson, Taylor & Hunt, P.A.

(57) ABSTRACT

A method and device for detecting an electrical continuity fault between a first and a second points of a network of metallization strips, including determining, from mapping, a length or a duration of a shortest path between the first and the second points, sending, at the first point, a signal in the network, detecting, at the second point, the signal sent, measuring a duration between the sending and the detection of the signal, knowing the speed of propagation of the signal in the metallization strips, determining the presence of at least one electrical continuity fault if the distance traveled calculated from the measured duration is different from the length of the shortest path determined from the mapping or if the measured duration is different from the duration to travel the shortest path determined from the mapping.

9 Claims, 2 Drawing Sheets

(56) References Cited

U.S. PATENT DOCUMENTS

2012/0223720 A1    9/2012  Landes et al.
2014/0208852 A1*   7/2014  Instanes ................ G01B 17/02
                                                        73/594

* cited by examiner

METHOD FOR DETECTING AN ELECTRICAL CONTINUITY FAULT IN A NETWORK OF METALLIZATION STRIPS AND DEVICE FOR IMPLEMENTING SAME

TECHNICAL FIELD

The present disclosure relates to a method for detecting an electrical continuity fault in a network of metallization strips and to a device for implementing same.

BACKGROUND

In the field of aeronautical construction, increasing use is being made of composite materials such as, for example, carbon fibre reinforced polymers (CFRP), notably to produce the fuselage.

Although the use of such materials allows for a weight saving, the fact that these materials are not electrically conductive dictates the need to provide a network of metallization strips to ensure the electrical ground return for the electrical network.

These metallization strips each take the form of a longilinear element with a small thickness made of an electrically conductive material.

These metallization strips are interconnected so as to produce an electrical network of conductive elements.

Thus, a network comprises a multitude of metallization strips connected at their ends and a multitude of connections at which at least two metallization strips are connected.

Hereinafter in the description 'a simple connection' will be understood to be a connection at which only two metallization strips are linked together and a 'node' will be understood to be a connection at which at least three metallization strips are connected together. A section of the network corresponds to the metallization strips connected in series between two nodes.

To ensure optimal operation of the ground return, all the metallization strips have to be at the same potential and be correctly connected together electrically.

When checking a network of great length, if a potential difference appears between two distant points of the network, it is necessary, using an ohmmeter for example, to test the electrical continuity of each section, and then, when the defective section is discovered, to check the conductivity of each metallization strip and of each simple connection of the section in order to identify the defective metallization strip(s) and/or simple connection(s).

Given all of these checks, locating an electrical continuity fault in a network of metallization strips proves to be a very tedious task.

SUMMARY

Thus, the present disclosure aims to remedy the problems of the prior art.

To this end, the present disclosure provides a method for detecting an electrical continuity fault between a first and a second points of a network of metallization strips, the method comprising:

determining, from a mapping of the network, a length or a duration of a shortest path between the first and the second points,
sending, at the first point, a signal in the network,
in detecting, at the second point, the signal sent,
measuring duration between the sending and the detection of the signal,
knowing the speed of propagation of the signal in the metallization strips, in determining the presence of at least one electrical continuity fault if the distance traveled calculated from the measured duration is different from the length of the shortest path determined from the mapping or if the measured duration is different from the duration to travel the shortest path determined from the mapping.

This solution makes it possible to rapidly detect an electrical continuity fault.

Advantageously, the method comprises locating the electrical continuity fault by determining the path traveled by the signal.

According to a variant, the method comprises:

calculating, from the lengths of the metallization strips listed in the mapping, durations of the paths between the first and the second points,
comparing the measured duration with the calculated durations,
determining the path traveled by the signal, the path traveled by the signal having a duration of travel substantially equal to the measured duration.

According to another variant, the method comprises:

calculating, from the lengths of the metallization strips listed in the mapping, lengths of the paths between the first and the second points,
calculating, from the measured duration, the distance traveled,
comparing the distance traveled with the calculated path lengths,
determining the path traveled by the signal, the path traveled by the signal having a length substantially equal to the distance traveled calculated from the measured duration.

Advantageously, the signal sent is an electrical signal comprising at least one pulse of Dirac type.

Another subject of the disclosure is a device for implementing the method. The device can in one aspect comprise:

a timer for timing a duration for a signal to go from the first point to the second point, the timer comprising a unit, a sender which comprises a sender connector for temporarily connecting it to the first point of the network, at least one signal receiver which comprises a receiver connector for temporarily connecting it to the second point of the network remote from the first point,
a memory listing the mapping of the network with, notably for each metallization strip, its length, and
a computer or calculator for calculating lengths or durations and for comparing them.

According to one aspect, the sender and the receiver(s) each comprise a clock with an accuracy of the order of a nanosecond, the different clocks being synchronized, as well as a communicator for communicating with the unit.

According to one feature, the unit comprises a calculator for calculating the duration of the path of the signal between the two points from information received from the sender and from the receiver(s).

BRIEF DESCRIPTION OF THE DRAWINGS

Other features and advantages will emerge from the following description of the disclosure, the description being given purely as an example, in light of the attached drawings in which.

DETAILED DESCRIPTION

In the different figures, a part of a network is represented comprising a number of metallization strips generally referenced 10.

According to one application, this network of metallization strips is incorporated in an aircraft comprising parts made of composite material, not electrically conductive, and makes it possible to establish an electrical ground return.

Electrical ground in an electrical circuit is understood to be the reference branch of the electrical potentials.

Hereinafter in the description, a 'metallization strip' will be understood to be a longilinear element made of an electrically conductive material.

The metallization strips 10 are connected together at connections 12, notably simple connections or nodes.

The metallization strips 10 of one and the same network can all be different.

Figure 1A:
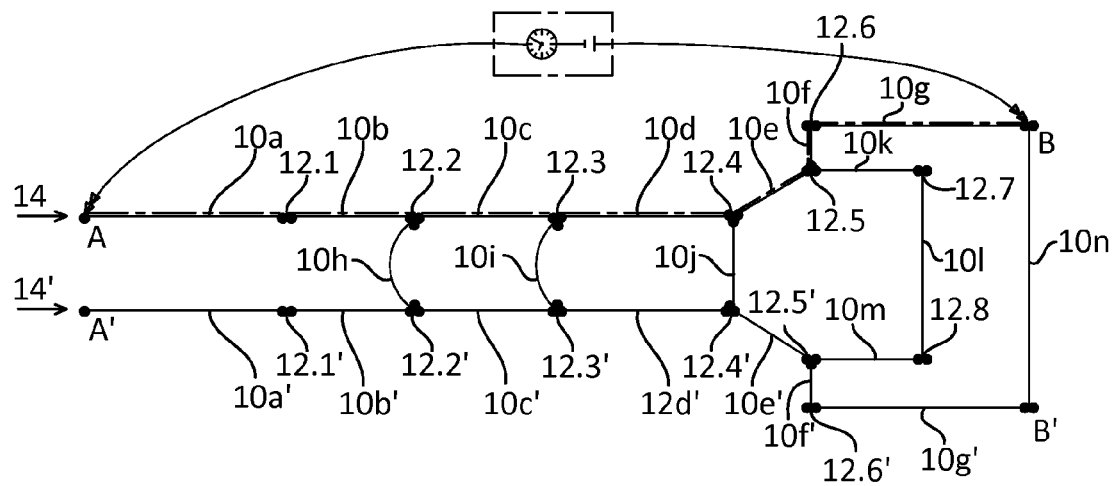
FIG. 1A is a schematic representation of a network of metallization strips with no electrical continuity fault.
Figure 1B:
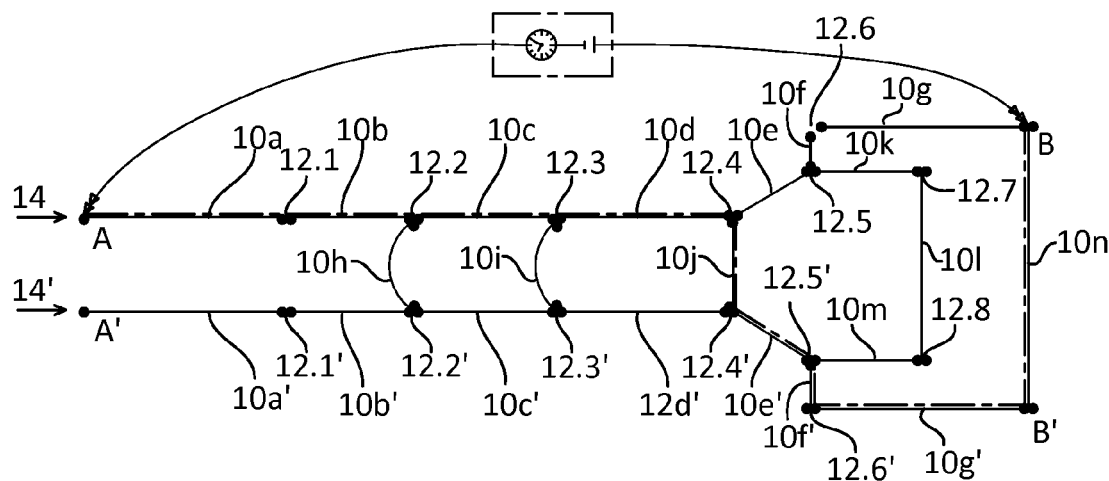
FIG. 1B is a schematic representation of the network of FIG. 1A with an electrical continuity fault.

As illustrated in FIGS. 1A and 1B, the network comprises a number of models of metallization strips, the metallization strips of one and the same model being identical, one and the same model being able to be present multiple times in the network. Preferably, the metallization strips are differentiated from one model to another by their lengths. Thus, the metallization strips of one and the same model all have the same length.

According to the example illustrated, the network comprises two parallel branches 14 and 14' which extend between the points A and B for the first branch 14 and between the points A' and B' for the second branch 14'. The two branches 14, 14' are identical and each comprise seven metallization strips in series 10a to 10g for the first branch 14 and 10a' to 10g' for the second branch 14', connected together by connections 12.1 to 12.6 for the first branch 14 and by connections 12.1' to 12.6' for the second branch 14'. The metallization strips 10a and 10a' are identical, like the strips 10b and 10b', 10c and 10c', 10d and 10d', 10e and 10e', 10f and 10f', 10g and 10g'. For each branch, the metallization strips 10b, 10b', 10e and 10e' are identical.

The connections 12.2 and 12.2' are linked by a metallization strip 10h. The connections 12.3 and 12.3' are linked by a metallization strip 10i. The connections 12.4 and 12.4' are linked by a metallization strip 10j. The connections 12.5 and 12.5' are linked by three metallization strips 10k, 10l and 10m linked in series by connections 12.7 and 12.8. The points B and B' are linked by a metallization strip 10n. According to the example illustrated in FIGS. 1A and 1B, the metallization strips 10h, 10i, 10k and 10m are identical.

Obviously, the network of metallization strips is not limited to the embodiment described above.

More broadly, a network of metallization strips comprises a plurality of metallization strips 10 linked together by connections 12 so as to define a meshing. Each metallization strip 10 is characterized among other things by its length, namely the distance separating the connections of one and the same metallization strip.

Preferably, all the metallization strips of a network are made of the same material. According to one embodiment, all the metallization strips are made of aluminium alloy.

Thus, apart from their lengths, the metallization strips have the same characteristics electrically.

According to one aspect, two points of the network are generally linked by at least two paths. As an example, the points A and B are linked by a first path which comprises the metallization strips 10a, 10b, 10c, 10d, 10e, 10f and 10g and by a second path 10a, 10b, 10c, 10d, 10j, 10e', 10f', 10g' and 10n.

According to a feature of the disclosure, a network of metallization strips is defined by a mapping listing, for each metallization strip, at least its length. Preferably, the mapping lists all the metallization strips with, for each of them, its length and all the connections with, for each of them, the list of metallization strips linked.

From this mapping, it is possible to establish, using itinerary computation software, the length of the different paths linking a first point and a second point of the network and, by comparing the different lengths, to determine the shortest path.

The itinary computation software is not detailed further because this type of software is widely known and used in the field of road traffic for example. The method for detecting at least one electrical continuity fault between two points A and B of a network of metallization strips comprises the steps which consist in transmitting a signal from one of the two points, for example the point A, and in measuring the duration necessary for the signal to reach the second point B. Knowing the speed of propagation of the signal in the material of the metallization strips, which is a constant, it is possible to determine, from the measured duration, the distance traveled by the signal to go from the first point A to the point B. Thus, the distance traveled is equal to the measured duration multiplied by the propagation speed.

The propagation speed is determined from charts or tests.

The method comprises a final step comprising diagnosing the existence or not of at least one electrical continuity fault between the points A and B of the network of metallization strips.

If the distance traveled calculated from the measured duration is substantially equal to the length of the shortest path determined from the mapping, there is no electrical continuity fault between the points A and B of the network of metallization strips.

If the distance traveled calculated from the measured duration is different from the length of the shortest path determined from the mapping, there is at least one electrical continuity fault between the points A and B of the network of metallization strips.

For the description, the expression 'substantially equal' means that the difference between the distance traveled calculated from the measured duration and the length of the shortest path determined from the mapping is less than a tolerance interval IT notably inherent in the duration measurement approximations.

The expression 'different' means that the difference between the distance traveled calculated from the measured duration and the length of the shortest path determined from the mapping is greater than the tolerance interval IT.

To reduce this tolerance interval, an electrical signal, preferably comprising at least one pulse of Dirac type, is used.

To give an order of magnitude, the tolerance interval IT is of the order of 5%.

Advantageously, in the presence of an electrical continuity fault, the method comprises a step comprising locating the fault by determining the path traveled by the signal.

Thus, knowing the distance traveled by the signal calculated from the measured duration, it is possible to determine the path traveled by the signal between the point A and the point B, by comparing the distance with the lengths of the different paths between the points A and B determined from the mapping, the path traveled by the signal having a length substantially equal to the distance traveled calculated from the measured duration.

Knowing the path traveled by the signal, it is possible to approximately determine the part or parts of the network exhibiting an electrical continuity fault.

FIG. 1A shows, by chain-dotted lines parallel to the metallization strips, the path of a signal going from the point A to the point B.

As an example, according to the mapping, the metallization strips have the following lengths:
the metallization strip 10a has a length of 1300 mm,
the metallization strip 10b has a length of 800 mm,
the metallization strip 10c has a length of 900 mm,
the metallization strip 10d has a length of 1100 mm,
the metallization strip 10e or 10e' has a length of 800 mm,
the metallization strip 10f or 10f' has a length of 300 mm,
the metallization strip 10g or 10g' has a length of 1400 mm,
the metallization strip 10h has a length of 700 mm,
the metallization strip 10i has a length of 700 mm,
the metallization strip 10j has a length of 600 mm,
the metallization strip 10k has a length of 700 mm,
the metallization strip 10l has a length of 1200 mm,
the metallization strip 10m has a length of 700 mm,
the metallization strip 10n has a length of 1800 mm.

From these values, the length of the shortest path between the points A and B, i.e. 6600 mm, is determined by notably using itinary computation software.

According to the disclosure, in order to detect a possible electrical continuity fault between the points A and B, a signal is transmitted from one of the two points and the time it takes for the signal to reach the other point is measured.

From the measured duration of the order 24 ns, knowing the speed of propagation of the signal which is equal to 273000 km/s, the distance traveled by the signal is calculated: 273×24=6552 mm which is substantially equal to 6600. Consequently, it can be concluded therefrom that there is no electrical continuity fault between the points A and B.

If the measured duration is of the order of 33 ns, knowing the speed of propagation of the signal, the distance traveled by the signal is calculated: 273×33=9009 mm which is different from 6600. Consequently, it can be concluded therefrom that there is an electrical continuity fault between the points A and B.

From the mapping, it is possible, using the itinary computation software, to determine the length of a first path that can be envisaged passing through the metallization strips 10a, 10b, 10c, 10d, 10j, 10e', 10f', 10g', 10n which is equal to 9000 mm and the length of a second path that can be envisaged passing through the metallization strips 10a, 10b, 10c, 10d, 10e, 10k, 10l, 10m, 10f', 10g', 10n which is equal to 11000 mm.

To identify the fault the distance traveled by the signal is compared with the lengths of the different paths that can be envisaged and the path traveled by the signal is thus determined.

In the present case, it is determined that the path traveled by the signal passes through the metallization strips 10a, 10b, 10c, 10d, 10j, 10e', 10f', 10g', 10n as illustrated in FIG. 1B.

Consequently, the fault can be located in the metallization strips 10e, 10f, 10g and/or at the connections 12.5 and/or 12.6.

To better locate the fault, the implementation of the method is reiterated between the connection 12.5 and the point B.

Since the distance traveled by the signal calculated from the measured duration is different from the length of the shortest path determined from the mapping it is determined that an electrical continuity fault exists between the connection 12.5 and the point B, as illustrated in FIG. 1B.

Thus, very rapidly, it has been possible to accurately locate the fault at the connection 12.6 as illustrated in FIG. 1B.

The method of the disclosure has been described according to a variant which comprises comparing lengths or distances.

According to another variant, the method of the disclosure can comprise comparing durations. In this case, from the mapping, it is possible to determine the duration necessary for a signal to travel a given path.

If the measured duration for the signal to go from a point A to a point B is substantially equal to the duration to travel the shortest path determined from the mapping, there is no electrical continuity fault between the points A and B of the network of metallization strips.

If the measured duration for the signal to go from a point A to a point B is different from the duration to travel the shortest path determined from the mapping, there is an electrical continuity fault between the points A and B of the network of metallization strips.

Furthermore, to locate the fault, the method comprises comparing the measured duration with the durations of the paths between the two points determined from the mapping, the path traveled by the signal having a duration of travel substantially equal to the measured duration.

Figure 2:
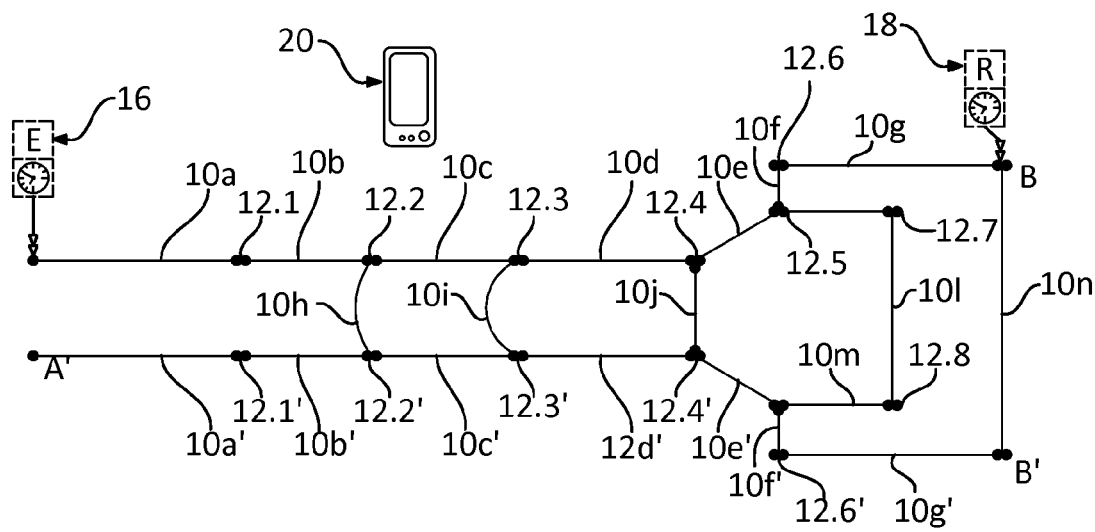
FIG. 2 is a schematic representation of a device making it possible to detect an electrical continuity fault which illustrates a variant of the disclosure, the device being used to detect a fault in the network illustrated in FIG. 1A.
Figure 3:
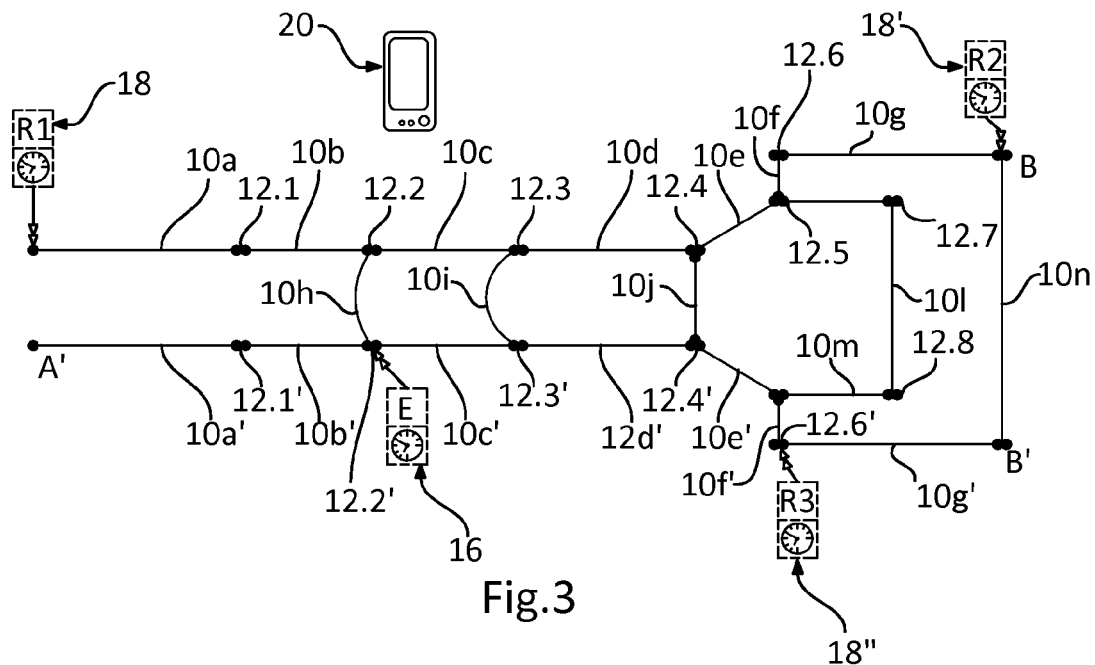
FIG. 3 is a schematic representation of a device making it possible to detect an electrical continuity fault which illustrates another variant of the disclosure, the device being used to detect a fault in the network illustrated in FIG. 1A.

FIGS. 2 and 3 show a device for implementing the method of the disclosure in one aspect.

According to the disclosure, the device for checking at least one electrical continuity defect comprises a signal sender 16, at least one signal receiver 18 and a unit 20.

The signal sender 16 comprises a sender connector for temporarily connecting it at a point of a network, notably at a connection.

Preferably, the signal sender 16 is a sender of electrical signals capable of sending a pulse of Dirac type.

A signal receiver 18 comprises a receiver connector for temporarily connecting it at a point of a network, notably at a connection.

The signal receiver 18 is configured for detecting a signal sent by the signal sender 16.

According to a feature of the disclosure, the sender 16 and the receiver(s) 18 each comprise a clock with an accuracy of the order of a nanosecond, notably an atomic micro-clock, the different clocks being synchronized in such a way as to make it possible to measure the duration between the sending of the signal sent by the signal sender 16 and the reception of the signal by a signal receiver 18.

According to one embodiment, the signal sender 16 comprises a communicator for communicating with the unit 20. Thus, the signal sender 16 can indicate the time corresponding to the sending of the signal in the network of metallization strips.

According to one embodiment, the signal receiver 18 comprises a communicator for communicating with the unit 20. Thus, the signal receiver 18 can indicate the time corresponding to the reception of the signal.

The unit 20 comprises a memory comprising the mapping of the network of metallization strips which lists all the metallization strips with, for each of them, its length and all the connections with, for each of them, the list of the metallization strips linked, software which makes it possible to determine the length of different paths between two points of the network from the mapping, a computer or calculator for calculating the lengths or durations and for comparing them and a communicator for communicating with the signal sender 16 and the signal receiver(s) 18.

From the information received from the sender 16 and from the receiver(s) 18, namely the time corresponding to the sending of the signal by the sender and the time corresponding to the reception of the signal by each receiver, the computer or calculator of the unit 20 calculates the duration of the path of the signal between the two points.

According to one embodiment, the unit 20 takes the form of a computer or any other apparatus incorporating at least one microprocessor.

According to another variant, the unit 20 can be incorporated in the signal sender or in a signal receiver.

The disclosure is not limited to this embodiment.

Whatever the variant, a device for detecting an electrical continuity fault between two points of a network of metallization strips comprises a timer for timing the duration for a signal to go from one point to another, a memory listing the mapping of the network with, notably for each metallization strip, its length, and a computer or calculator for calculating lengths or durations and for comparing them.

According to an embodiment illustrated in FIG. 2, the device comprises a single signal receiver 18. As an example, the signal sender 16 is positioned at the point A and the signal receiver 18 at the point B.

According to another embodiment illustrated in FIG. 3, the device comprises a plurality of signal receivers 18. As an example, the signal sender 16 is positioned at the connection 12.2', a first signal receiver 18 is positioned at the point A, a second signal receiver 18' is positioned at the point B and a third signal receiver 18" is positioned at 12.6'.

According to this embodiment the signal receivers 18, 18', 18" are positioned at strategic points in order to facilitate the locating of an electrical continuity fault.

The subject matter disclosed herein can be implemented in software in combination with hardware and/or firmware. For example, the subject matter described herein can be implemented in software executed by a processor. In one exemplary implementation, the subject matter described herein can be implemented using a computer readable medium having stored thereon computer executable instructions that when executed by a processor of a computer control the computer to perform steps. Exemplary computer readable mediums suitable for implementing the subject matter described herein include non-transitory devices, such as disk memory devices, chip memory devices, programmable logic devices, and application specific integrated circuits. In addition, a computer readable medium that implements the subject matter described herein can be located on a single device or computing platform or can be distributed across multiple devices or computing platforms.

While the disclosure herein has been described herein in reference to specific embodiments, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein. Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims. It is understood that various details of the presently disclosed subject matter may be changed without departing from the scope of the presently disclosed subject matter. Furthermore, the foregoing description is for the purpose of illustration only, and not for the purpose of limitation.

The invention claimed is:

1. A method for detecting an electrical continuity fault between a first and a second points of a network of metallization strips, the network being defined by a mapping listing, for each metallization strip, its length, the method comprising:
   determining, from the mapping, a length of a shortest path between the first and the second points;
   sending, at the first point, a signal in the network;
   detecting, at the second point, the signal sent;
   measuring a duration between the sending and the detection of the signal; and
   knowing speed of propagation of the signal in the metallization strips, determining a presence of at least one electrical continuity fault in the network of metallization strips between the first and second points of the network of metallization strips if the distance traveled calculated from the measured duration is different from the length of the shortest path determined from the mapping.

2. The method according to claim 1, comprising locating the electrical continuity fault by determining a path traveled by the signal.

3. The method according to claim 2, comprising:
   calculating, from the lengths of the metallization strips listed in the mapping, durations of the paths between the first and the second points;
   comparing the measured duration with the calculated durations;
   determining the path traveled by the signal, the path traveled by the signal having a duration of travel substantially equal to the measured duration.

4. The method according to claim 2, comprising:
   calculating, from the lengths of the metallization strips listed in the mapping, lengths of the paths between the first and the second points,
   calculating, from the measured duration, the distance traveled,
   comparing the distance traveled with the calculated path lengths,
   determining the path traveled by the signal, the path traveled by the signal having a length substantially equal to the distance traveled calculated from the measured duration.

5. The method according to claim 1 wherein the signal sent is an electrical signal comprising at least one pulse of Dirac type.

6. A method for detecting an electrical continuity fault between a first and a second points of a network of metallization strips, the network being defined by a mapping listing, for each metallization strip, its length, the method comprising:
 determining, from the mapping, a duration of a shortest path between the first and the second points,
 sending, at the first point, a signal in the network,
 detecting, at the second point, the signal sent,
 measuring a duration between the sending and the detection of the signal,
 knowing the speed of propagation of the signal in the metallization strips, determining a presence of at least one electrical continuity fault in the network of metallization strips between the first and second points of the network of metallization strips if the measured duration is different from the duration to travel the shortest path determined from the mapping.

7. A device for implementing a method for detecting an electrical continuity fault between a first and a second points of a network of metallization strips according to claim 1, comprising:
 a timer for timing a duration for a signal to go from the first point to the second point, the timer comprising a unit, a sender which comprises a sender connector for temporarily connecting it to the first point of the network, at least one signal receiver which comprises a receiver connector for temporarily connecting it to the second point of the network remote from the first point;
 a memory listing the mapping of the network with, notably for each metallization strip, its length; and
 a computer for calculating lengths or durations and for comparing them.

8. The device according to claim 7, wherein the sender and the receiver(s) each comprise a clock with an accuracy of the order of a nanosecond, the different clocks being synchronized, as well as a communicator for communicating with the unit.

9. The device according to claim 8, wherein the unit comprises a calculator for calculating the duration of the path of the signal between the two points from information received from the sender and from the receiver(s).

* * * * *